(12) United States Patent
Kim et al.

(10) Patent No.: US 10,761,363 B2
(45) Date of Patent: Sep. 1, 2020

(54) DISPLAY DEVICE AND METHOD OF FABRICATING THE DISPLAY DEVICE

(71) Applicant: Samsung Display Co., Ltd., Yongin-Si, Gyeonggi-Do (KR)

(72) Inventors: Soodong Kim, Hwaseong-si (KR); Jinwon Kim, Suwon-si (KR); Taeho Kim, Yongin-si (KR); Minki Nam, Incheon (KR); Kyoungwon Park, Seoul (KR)

(73) Assignee: Samsung Display Co., Ltd. (KR)

( * ) Notice: Subject to any disclaimer, the term of this patent is extended or adjusted under 35 U.S.C. 154(b) by 64 days.

(21) Appl. No.: 15/971,523

(22) Filed: May 4, 2018

(65) Prior Publication Data

US 2019/0025638 A1 Jan. 24, 2019

(30) Foreign Application Priority Data

Jul. 20, 2017 (KR) ........................ 10-2017-0092267

(51) Int. Cl.
*G02F 1/1335* (2006.01)
*G02F 1/13357* (2006.01)
*G02B 6/00* (2006.01)
*H01L 27/32* (2006.01)

(52) U.S. Cl.
CPC ......... *G02F 1/133514* (2013.01); *G02B 6/00* (2013.01); *G02F 1/133512* (2013.01); *G02F 1/133528* (2013.01); *G02F 1/133602* (2013.01); *G02F 1/133603* (2013.01); *G02F 1/133617* (2013.01); *H01L 27/32* (2013.01); *G02F 2001/133614* (2013.01); *G02F 2202/36* (2013.01); *G02F 2203/055* (2013.01); *H01L 27/322* (2013.01); *H01L 2251/5369* (2013.01)

(58) Field of Classification Search
CPC ............... G02F 2001/133614; G02F 2203/055
See application file for complete search history.

(56) References Cited

U.S. PATENT DOCUMENTS

| 8,648,524 B2 | 2/2014 | Weiss et al. | |
|---|---|---|---|
| 8,675,167 B2 | 3/2014 | Jang et al. | |
| 2006/0244872 A1* | 11/2006 | Kim ................. | G02F 1/133514 349/25 |
| 2006/0284532 A1* | 12/2006 | Kurihara ........... | G02F 1/133617 313/110 |
| 2009/0051842 A1* | 2/2009 | Kim ................. | G02F 1/134363 349/40 |

(Continued)

FOREIGN PATENT DOCUMENTS

| KR | 10-1584663 B1 | 1/2016 |
|---|---|---|
| KR | 10-2016-0017373 A | 2/2016 |

*Primary Examiner* — Alexander P Gross
(74) *Attorney, Agent, or Firm* — Innovation Counsel LLP

(57) ABSTRACT

A method of fabricating a display device may include the following steps: patterning a light blocking layer on a first surface of a first substrate, forming a color filter layer on a second surface of the first substrate opposite the first surface after the patterning of the light blocking layer, and forming a light conversion layer including a plurality of conversion filters on the first surface of the first substrate after the forming of the color filter layer. Each of the conversion filters may include a plurality of conversion particles, and the color filter layer may be formed to selectively transmit light emitted from each of the conversion filters.

18 Claims, 11 Drawing Sheets

(56) References Cited

U.S. PATENT DOCUMENTS

| | | | |
|---|---|---|---|
| 2013/0002986 A1* | 1/2013 | Kadowaki | G02F 1/133617 |
| | | | 349/65 |
| 2013/0293802 A1* | 11/2013 | Chae | G02B 5/201 |
| | | | 349/58 |
| 2016/0041430 A1 | 2/2016 | Lee et al. | |
| 2016/0048029 A1* | 2/2016 | An | G02B 27/2214 |
| | | | 359/467 |
| 2016/0070136 A1* | 3/2016 | Jang | G02F 1/133514 |
| | | | 349/61 |
| 2016/0202548 A1* | 7/2016 | Lee | G02B 5/201 |
| | | | 349/43 |
| 2017/0255056 A1* | 9/2017 | Liu | G02F 1/133512 |

\* cited by examiner

DISPLAY DEVICE AND METHOD OF FABRICATING THE DISPLAY DEVICE

CROSS-REFERENCE TO RELATED APPLICATION(S)

This U.S. non-provisional patent application claims priority under 35 U.S.C. § 119 to Korean Patent Application No. 10-2017-0092267, filed on Jul. 20, 2017, in the Korean Intellectual Property Office; the entire contents of the Korean Patent Application are incorporated herein by reference.

BACKGROUND OF THE INVENTION

The technical field relates to a display device and a method of fabricating the display device.

A modern display device typically includes a plurality of pixels, each of which includes a thin-film transistor for controlling a switching operation and/or for controlling supply of a voltage to a corresponding pixel.

The display device may include a display panel and a backlight unit for providing light to the display panel. The backlight unit may include a light source and a light guide plate. Light generated by the light source may be provided through the light guide plate to the display panel.

SUMMARY

Some embodiments may be related to a display device with satisfactory display quality. Some embodiments may be related to a method of fabricating a display device.

According to some embodiments, a method of fabricating a display device may include forming an upper substrate, forming a lower substrate, and bonding the upper substrate with the lower substrate. The forming of the upper substrate may include patterning a light blocking layer on a first surface of a first substrate, forming a color filter layer on a second surface of the first substrate opposite to the first surface, after the patterning of the light blocking layer, and forming a light conversion layer including a plurality of conversion filters, on the first surface of the first substrate, after the forming of the color filter layer. Each of the plurality of conversion filters may include a plurality of conversion particles, and the color filter layer may be formed to selectively transmit light emitted from each of the conversion filters.

In some embodiments, the forming of the color filter layer may include turning upside down the first substrate and forming a color filter on the second surface of the first substrate.

In some embodiments, the forming of the color filter layer may further include forming an encapsulation layer on the color filter.

In some embodiments, the color filter may be formed to absorb a first light and to transmit a second light and a third light.

In some embodiments, the first light may be a blue light, the second light may be a red light, and the third light may be a green light.

In some embodiments, the color filter may include a first color filter absorbing a first light and transmitting a second light and a second color filter absorbing the first light and transmitting a third light.

In some embodiments, the color filter may have a thickness of about 1 μm or thicker.

In some embodiments, the forming of the light conversion layer may include turning upside down the first substrate, forming a conversion filters on the first surface of the first substrate to be overlapped with a region exposed by the light blocking layer, and forming an over-coating layer on the conversion filters.

In some embodiments, each of the conversion filters may have a thickness of about 7 μm or thicker.

In some embodiments, the light blocking layer may include a metallic material.

In some embodiments, the conversion filters may include first conversion filters including first conversion particles converting a first light into a second light and second conversion filters including second conversion particles converting the first light into a third light. The forming of the lower substrate may include forming a pixel definition layer on a base substrate and forming a light emitting layer on a region exposed by the pixel definition layer. The method may further include forming a second polarization layer on the light conversion layer of the upper substrate.

According to some embodiments, a display device may include a display module displaying an image using a first light. The display module may include an upper substrate and a lower substrate facing the upper substrate and including a plurality of pixels. The upper substrate may include a first substrate including a first surface adjacent to the liquid crystal layer and a second surface opposite to the first surface, a light blocking layer provided on the first surface, a light conversion layer provided on the first surface and overlapped with a region exposed by the light blocking layer, the light conversion layer converting the first light to a second light or a third light, and a color filter layer provided on the second surface, the color filter layer absorbing the third light and transmitting the second or third light.

In some embodiments, the display device may further include a light source configured to provide the first light to the display module and a liquid crystal layer interposed between the upper substrate and the lower substrate.

In some embodiments, the lower substrate may include a base substrate and a light emitting layer provided on the base substrate to generate the first light.

In some embodiments, the light conversion layer may include a first conversion filter including first conversion particles converting the first light to the second light, a second conversion filter including second conversion particles converting the first light to the third light, and an over-coating layer covering the first conversion filter and the second conversion filter.

In some embodiments, the display module may further include a wire grid polarizer provided on the over-coating layer.

In some embodiments, the color filter layer may include a first color filter absorbing the first light and transmitting the second light, a second color filter absorbing the first light and transmitting the third light, and an encapsulation layer covering the first color filter and the second color filter.

In some embodiments, the first color filter and the second color filter may be provided to have a thickness of about 1 μm or thicker.

An embodiment may be related to a method of fabricating a display device. The method may include the following steps: patterning a light blocking layer (directly) on a first surface of a first substrate, forming a color filter layer (directly) on a second surface of the first substrate opposite the first surface after the patterning of the light blocking layer, and forming a light conversion layer including a plurality of conversion filters (directly) on the first surface of the first substrate after the forming of the color filter layer. Each of the conversion filters may include a plurality of conversion particles. The first substrate may be positioned between the color filter layer and the light conversion layer.

The forming of the color filter layer may include the following steps: turning upside down the first substrate; and forming a color filter of the color filter layer on the second surface of the first substrate.

The method may include forming an encapsulation layer on the color filter.

The color filter may absorb a first-color light and may transmit at least one of a second-color light and a third-color light.

The first-color light may be a blue light, the second-color light may be a red light, and the third-color light may be a green light.

The color filter layer may include the following elements: a first color filter for absorbing a first portion of a first-color light and for transmitting a second-color light; and a second color filter for absorbing a second portion of the first-color light and for transmitting a third-color light.

The color filter may have a thickness of 1 µm or thicker.

The method may include forming an over-coating layer on the conversion filters. The forming of the light conversion layer may include the following steps: turning upside down the first substrate; and forming the conversion filters on portions of the first surface of the first substrate exposed by the light blocking layer.

Each of the conversion filters may have a thickness of 7 µm or thicker.

The light blocking layer may include a metallic material.

The conversion filters may include the following filters: a first conversion filter including first-type conversion particles for converting a first portion of a first-color light into a second-color light; and a second conversion filter including second-type conversion particles for converting a second portion of the first-color light into a third-color light.

The method may include the following steps: forming a pixel definition layer on a base substrate; forming a light emitting layer on a region of the base substrate exposed by the pixel definition layer; and positioning the first substrate and the base substrate to overlap each other.

The method may include forming a polarization layer on the light conversion layer.

An embodiment may be related to a display device. The display device may include the following elements: a first substrate including a first surface and a second surface opposite the first surface; a light blocking layer provided (directly) on the first surface; a light conversion layer provided (directly) on portions of the first surface exposed by the light blocking layer, for converting a first portion of a first-color light to at least one of a second-color light and a third-color light; and a color filter layer provided on the second surface. The color filter layer may absorb a second portion of the first light and may transmit the second-color light and/or the third-color light. The first substrate may be positioned between the color filter layer and the light conversion layer.

The display device may include the following elements: a light source configured to provide the first-color light; and a liquid crystal layer overlapping the first substrate.

The display device may include the following elements: a base substrate overlapping the first substrate; and a light emitting layer provided on the base substrate and configured to generate the first-color light.

The display device may include an over-coating layer. The light conversion layer may include the following filters: a first conversion filter including first-type conversion particles for converting a first part of the first portion of the first-color light to the second-color light; and a second conversion filter including second-type conversion particles for converting a second part of the first portion of the first-color light to the third light. The over-coating layer may cover both the first conversion filter and the second conversion filter.

The display device may include a wire grid polarizer provided on the over-coating layer.

The display device may include an encapsulation layer. The color filter layer may include the following filters: a first color filter for absorbing a first part of the second portion the first-color light and for transmitting the second-color light; and a second color filter for absorbing a second part of the second portion of the first-color light and for transmitting the third-color light. The encapsulation layer may cover both the first color filter and the second color filter.

Each of the first color filter and the second color filter may have a thickness of 1 µm or thicker.

DETAILED DESCRIPTION

Figure 1:
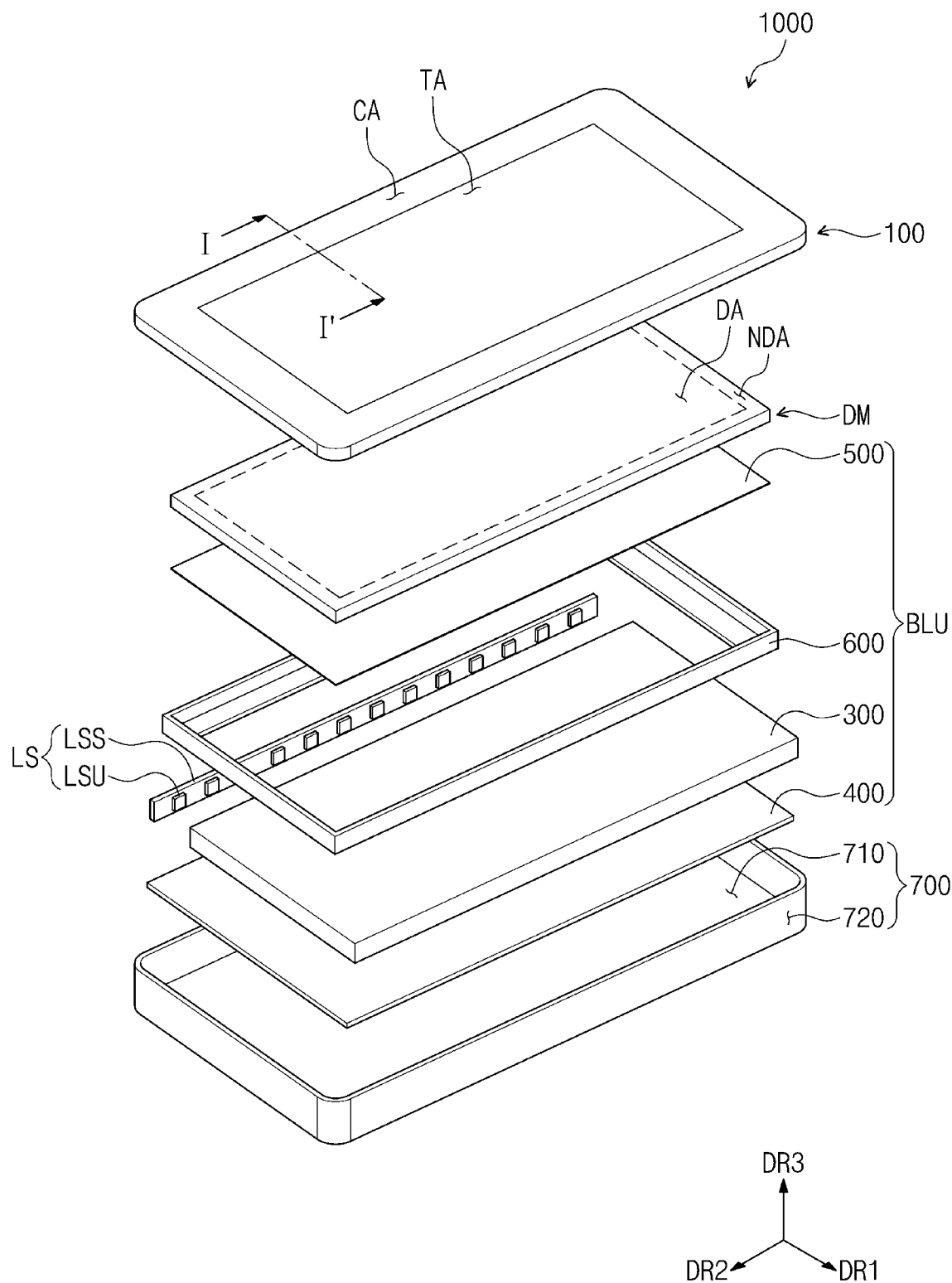
FIG. 1 is an exploded perspective view of a display device according to embodiments.

Example embodiments are described with reference to the accompanying drawings. Practical embodiments may be embodied in many different forms and should not be construed as being limited to the embodiments set forth herein. In the drawings, thicknesses of layers and regions may be exaggerated for clarity. Like reference numerals in the drawings may denote like elements.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "connected" or "coupled" to a second element, the first element can be directly connected or coupled to the second element, or one or more intervening elements may be present between the first element and the second element. When a first element is referred to as being "directly connected" or "directly coupled" to a second element, there are no intended intervening elements (except environmental elements such as air) connected between the first element and the second element. Other words used to describe the relationship between elements should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used to describe one element's relationship to another element as illustrated in the figures. The spatially relative terms may encompass different orientations of the device in use or operation in addition to the orientation depicted in the figures. For example, if the device in the figures is turned over, elements described as "below" or "beneath" other elements or features would then be positioned "above" the other elements or features. Thus, the term "below" can encompass both an orientation of above and below. The device may be otherwise oriented (rotated 90 degrees or at other orientations), and the spatially relative descriptors should be interpreted accordingly.

The terminology used herein is for the purpose of describing particular embodiments and is not intended to be limiting of example embodiments. As used herein, the singular forms "a," "an" and "the" may include the plural forms as well, unless the context clearly indicates otherwise. The terms "comprises", "comprising", "includes" and/or "including" may specify the presence of stated features, integers, steps, operations, elements, and/or components, but do not preclude the presence or addition of one or more other features, integers, steps, operations, elements, components, and/or groups.

Unless otherwise defined, all terms (including technical and scientific terms) used herein have the same meaning as commonly understood by one of ordinary skill in the pertinent art. Terms, such as those defined in commonly-used dictionaries, should be interpreted as having a meaning that is consistent with their meaning in the context of the relevant art and should not be interpreted in an idealized or overly formal sense unless expressly so defined herein.

Figure 2:
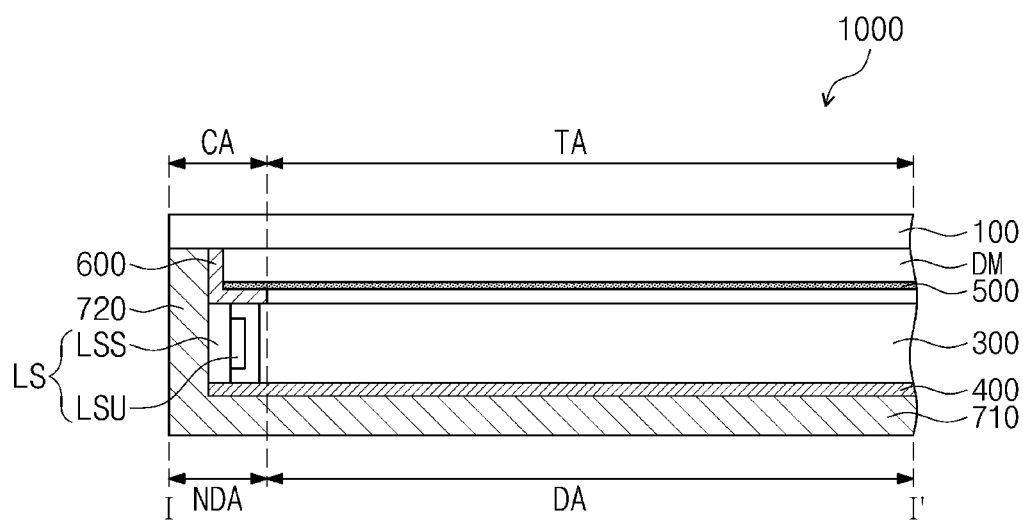
FIG. 2 is a cross-sectional view taken along line I-I' of FIG. 1 according to embodiments.

FIG. 1 is an exploded perspective view of a display device according to some embodiments, and FIG. 2 is a sectional view taken along line I-I' of FIG. 1 according to some embodiments.

Referring to FIGS. 1 and 2, a display device 1000 according to some embodiments may have a substantially rectangular shape whose short sides are parallel to (or extend in) a first direction DR1 and whose long sides are parallel to (or extend in) a second direction DR2. In embodiments, the display device 1000 may have one or more other shapes.

The display device 1000 may include a window structure 100, a display module DM, a backlight unit BLU, and a container structure 700.

For convenience in description, a transmission direction of light in the display device 1000 will be referred to as an upward direction, and a direction opposite to the upward direction will be referred to as a downward direction. The upward and downward directions may be in a third direction DR3 that is orthogonal to the first and second directions DR1 and DR2.

The window structure 100 may include a light-transmitting region TA, which is configured to allow light provided from the display module DM to pass through, and a light-blocking region CA, which is adjacent to the light-transmitting region TA and is configured to block light. In a plan view defined by the first and second directions DR1 and DR2, the light-transmitting region TA may be positioned at a center region of the display device 1000. The light-blocking region CA may surround the light-transmitting region TA. For example, the light-blocking region CA may be a frame.

In certain embodiments, the window structure 100 of the display device 1000 may include the light-transmitting region TA but may not have the light-blocking region CA. In this case, the top surface of the window structure 100 may transmit the light.

The window structure 100 may be formed of or include at least one of glass, sapphire, or plastic materials.

The display module DM may be provided below the window structure 100. The display module DM may display an image using light provided from the backlight unit BLU.

When viewed in the plan view, the display module DM may include a display region DA, which is used to display an image, and a non-display region NDA, which is not used to display images. The display region DA may be at a center region of the display module DM and may overlap the light-transmitting region TA of the window structure 100. The non-display region NDA may surround the display region DA and may overlap the light-blocking region CA of the window structure 100. The display module DM is described in more detail with reference to FIG. 3.

The backlight unit BLU may be provided below the display module DM and may be used to provide light to the display module DM. In embodiments, the backlight unit BLU may be an edge-type backlight unit.

The backlight unit BLU may include a light source LS, a light guide plate 300, a reflection sheet 400, an optical member 500, and a mold frame 600.

The light source LS may be placed to face a side surface of the light guide plate 300 in the first direction DR1. In embodiments, the light source LS may be provided adjacent to at least one of side surfaces of the light guide plate 300.

The light source LS may include a plurality of light source units LSU and a light source substrate LSS. The light source units LSU may generate light, which will be provided to the display module DM through the light guide plate 300.

In embodiments, the light source units LSU may generate a first light. For example, the first light may have a wavelength ranging from about 400 nm to about 500 nm. In other words, the light source units LSU may generate substantially blue light.

In embodiments, each of the light source units LSU may be provided in the form of a point light source having a light emitting diode (LED).

In certain embodiments, the light source unit LSU may be/include a single LED serving as a point light source, a plurality of groups of LEDs, a plurality of LEDs, and/or a linear light source.

The light source units LSU may be mounted on the light source substrate LSS. The light source substrate LSS may face the side surface of the light guide plate 300 in the first direction DR1 and may extend in the second direction DR2. The light source substrate LSS may include a light source control unit (not shown), which is connected to the light source units LSU. The light source control unit may analyze an image to be displayed on the display module DM, to output a local dimming signal based on the image analysis, and to control brightness of light, which is generated by the light source units LSU, based on the local dimming signal. In certain embodiments, the light source control unit may be mounted on an additional circuit substrate.

The light guide plate 300 may be provided below the display module DM. The light guide plate 300 may have a plate shape. The light guide plate 300 may allow light, which is provided from the light source LS, to be transmitted toward the display module DM or in the upward direction. Although not shown in the drawings, a diffusion pattern (not shown) may be provided on the top surface of the light guide plate 300.

The light guide plate 300 may be formed of or include a material having high transmittance to a visible light. For example, the light guide plate 300 may be formed of or include a transparent polymer resin (e.g., polycarbonate or polymethyl methacrylate (PMMA)). In certain embodiments, the light guide plate 300 may include a glass material.

The reflection sheet 400 may be provided below the light guide plate 300. The reflection sheet 400 may reflect light, which propagates toward a bottom surface of the light guide plate 300, in the upward direction. The reflection sheet 400 may include a light-reflective material. For example, the reflection sheet 400 may include aluminum or silver.

The optical member 500 may be provided between the light guide plate 300 and the display module DM. Light, which is incident from the light guide plate 300 to the optical member 500, may be diffused and condensed by the optical member 500.

Although not shown in the drawings, the optical member 500 may include a plurality of sheets. For example, the optical member 500 may include a diffusion sheet, a prism sheet, and a protection sheet. The diffusion sheet may diffuse light provided from the light guide plate 300. The prism sheet may be provided on the diffusion sheet and may be used to condense light, which is diffused by the diffusion sheet and propagates in the upward direction. The protection sheet may protect prisms of the prism sheet against friction caused by an external object. However, the inventive concept is not limited to the number or kinds of sheets in the optical member 500.

The mold frame 600 may be provided between the light guide plate 300 and the optical member 500. In embodiments, the mold frame 600 may have a frame shape. For example, the mold frame 600 may be provided along an edge region of the top surface of the light guide plate 300. The display module DM and the optical member 500 may be placed on the mold frame 600. The mold frame 600 may fix and hold the display module DM, the optical member 500, and the backlight unit BLU.

The container structure 700 may be provided at a lowermost level of the display device 1000 and may contain the backlight unit BLU. The container structure 700 may include a bottom portion 710 and a plurality of sidewall portions 720, which are connected to the bottom portion 710. In some embodiments, the light source LS may be provided on an inner side surface of one of the sidewall portions 720 of the container structure 700. The container structure 700 may be formed of or include a metallic material having sufficiently high hardness.

Figure 3:
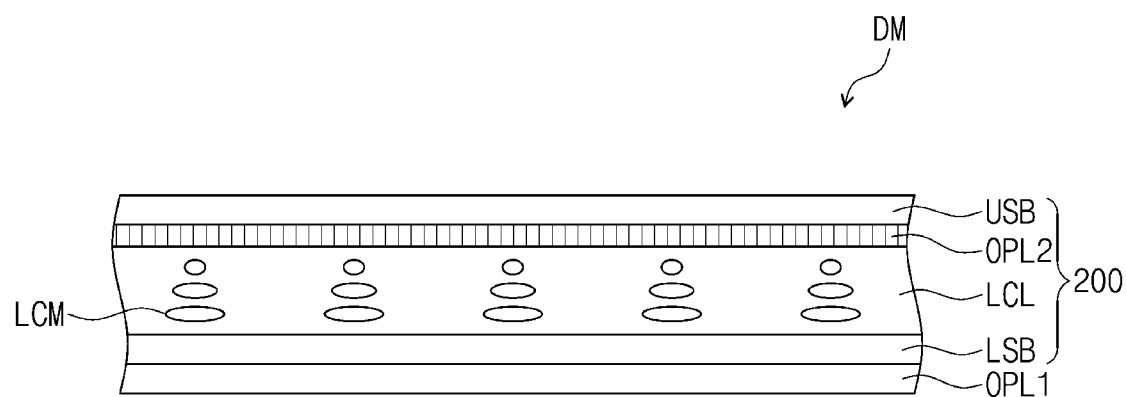
FIG. 3 is an enlarged cross-sectional view illustrating a display module according to embodiments.

FIG. 3 is an enlarged cross-sectional view illustrating a display module according to some embodiments.

Referring to FIG. 3, the display module DM may include a display panel 200 and a first polarization layer OPL1.

The first polarization layer OPL1 may be provided between the display panel 200 and the backlight unit BLU and may change a polarization state of light provided from the backlight unit BLU. The first polarization layer OPL1 may have a transmission axis (not shown) parallel to a predetermined direction.

Although not shown in the drawings, the first polarization layer OPL1 may be attached to the display module DM by an adhesive member.

In certain embodiments, although not shown in the drawings, the first polarization layer OPL1 may be provided in the display panel 200. The first polarization layer OPL1 may be a wire grid polarizer.

The display panel 200 may be provided on the first polarization layer OPL1 to display an image through the display region DA. The display panel 200 may be a light-receiving type display panel. For example, in some embodiments, the display panel 200 may be a liquid crystal display panel.

The display panel 200 may include a lower substrate LSB, an upper substrate USB, a liquid crystal layer LCL, and a second polarization layer OPL2.

The lower substrate LSB may be provided on the first polarization layer OPL1. The lower substrate LSB may be formed of or include a highly transparent material, and in this case, light provided from the backlight unit BLU may be easily transmitted through the lower substrate LSB. The lower substrate LSB may be a transparent glass substrate, a transparent plastic substrate, or a transparent film.

Although not shown, the lower substrate LSB may include at least one pixel region (not shown) and a peripheral region (not shown) adjacent to the pixel region. In embodiments, the lower substrate LSB may include a plurality of the pixel regions, and peripheral regions may be located between pixel regions.

Pixels (not shown) may be provided in the pixel regions, respectively, of the lower substrate LSB. The pixels may include pixel electrodes (not shown) and thin-film transistors (not shown), which are electrically connected to the pixel electrodes in a one-to-one manner. The thin-film transistors may be connected to the pixel electrodes, respectively, and may selectively provide driving signals to corresponding pixel electrodes.

The upper substrate USB may face the lower substrate LSB. The liquid crystal layer LCL may be interposed between the upper substrate USB and the lower substrate LSB. The liquid crystal layer LCL may include a plurality of liquid crystal molecules LCM oriented in one or more directions.

The upper substrate USB may include a common electrode (not shown), which is used to produce an electric field for controlling orientations of the liquid crystal molecules LCM, in conjunction with the pixel electrodes. The liquid crystal molecules LCM in the liquid crystal layer LCL may be controlled by the electric field to display an image in the upward or third direction DR3.

Although not shown, a driving chip, a tape carrier package, and a printed circuit board may be provided on or in the display panel 200. The driving chip may generate a driving signal, the tape carrier package may support the driving chip, and the printed circuit board may be electrically connected to the display panel 200 through the tape carrier package.

The second polarization layer OPL2 may be provided between the liquid crystal layer LCL and the upper substrate USB. In embodiments, the second polarization layer OPL2 may be a wire grid polarizer. Although not shown in the drawings, the second polarization layer OPL2 may include a plurality of nano wires (e.g., formed of a metallic material).

The second polarization layer OPL2 may have an absorption axis (not shown) parallel to a predetermined direction. When a display mode of the display device 1000 is in a bright state, the second polarization layer OPL2 may allow the light to pass through, and when the display mode of the display device 1000 is in a dark state, the second polarization layer OPL2 may absorb and/or block the light.

An angle between the transmission axis of the first polarization layer OPL1 and the absorption axis of the second polarization layer OPL2 may be configured depending on an orientation mode of the liquid crystal molecules LCM. As an example, the transmission axis of the first polarization layer OPL1 may be orthogonal to the absorption axis of the second polarization layer OPL2.

Figure 4:
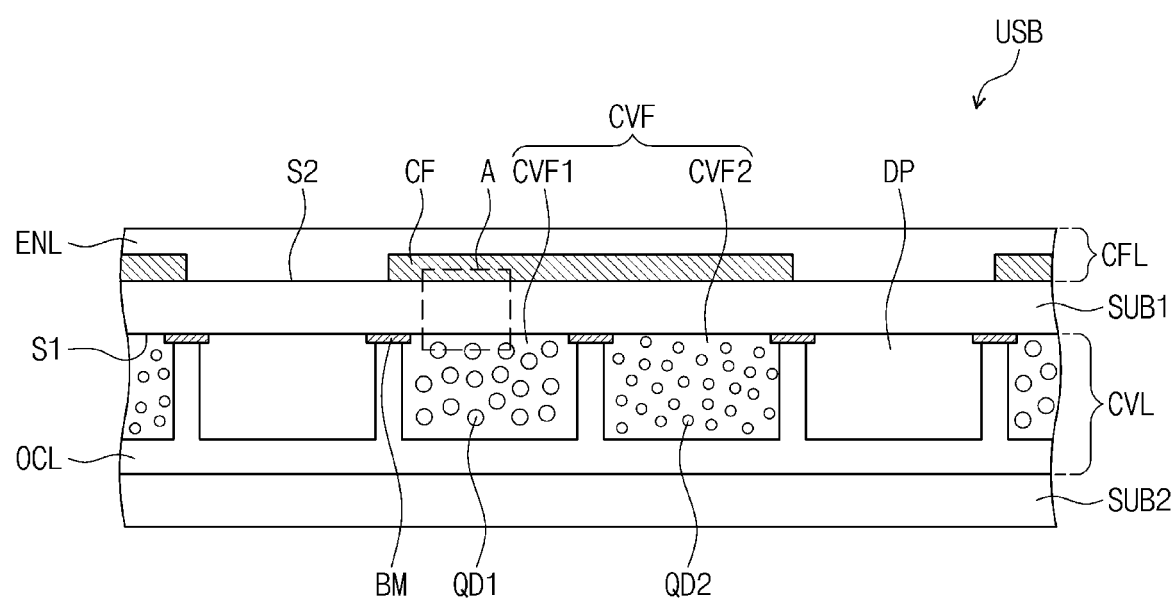
FIG. 4 is an enlarged cross-sectional view illustrating an upper substrate according to embodiments.

FIG. 4 is an enlarged cross-sectional view illustrating an upper substrate according to some embodiments.

Referring to FIG. 4, the upper substrate USB may include a first substrate SUB1, a second substrate SUB2, a light conversion layer CVL, and a color filter layer CFL.

The first substrate SUB1 may be formed of a highly transparent material. For example, the first substrate SUB1 may be a transparent glass substrate, a transparent plastic substrate, or a transparent film. In embodiments, the first substrate SUB1 may be a glass substrate and may have a first refractive index n1. The first refractive index n1 may range from about 1.45 to 1.55.

Hereinafter, for convenience in description, the rear surface of the first substrate SUB1 will be referred to as a first surface S1, and the front surface of the first substrate SUB1 will be referred to as a second surface S2.

The light conversion layer CVL may be provided between the first substrate SUB1 and the second substrate SUB2. The light conversion layer CVL may include a light blocking layer BM, a plurality of conversion filters CVF, a dummy pattern DP (or dummy member DP), and an over-coating layer OCL.

The light blocking layer BM may be provided (directly) on the first surface S1 of the first substrate SUB1. The light blocking layer BM may correspond to and/or overlap the afore-described peripheral region. The light blocking layer BM may expose regions of the first surface S1 corresponding to the pixel regions. The light blocking layer BM may prevent light from being leaked through a region between adjacent pixel regions, except for the pixel region, and thereby to clarify a boundary between adjacent pixel regions.

The light blocking layer BM may be formed of or include a light-blocking material. In embodiments, the light blocking layer BM may be formed of or include a metallic material. For example, the light blocking layer BM may have a thickness in a range from about 0.2 μm to 0.4 μm.

The conversion filters CVF may overlap the pixel regions. The conversion filters CVF may change color of light incident thereto, and by using the conversion filters CVF, it may be possible to realize an image with various colors. In embodiments, the conversion filters CVF may have a second refractive index n2. The second refractive index n2 may be greater than the first refractive index n1. For example, the second refractive index n2 may be in a range from about 1.65 to about 1.8.

Each of the conversion filters CVF may include a plurality of conversion particles QD1 and/or QD2. Each of the conversion particles may absorb at least a portion of an incident light and then emit light of a specific color or may transmit the portion of the incident light without a change in color.

If the energy of the light incident into a conversion filter CVF is high enough to excite conversion particles, the conversion particles may absorb at least a portion of the incident light to be in an excited state and then emit light of a specific color when they return to a stable or low-energy state. By contrast, if the energy of the incident light is too low to excite conversion particles, the incident light may pass through the conversion filter CVF without a change in color.

The color of light emitted from a conversion particle may be determined by a particle size of the conversion particle. In general, the larger the particle size, the longer the wavelength of the emitted light; and the smaller the particle size, the shorter the wavelength of the emitted light.

In embodiments, each of the conversion particles may be a quantum dot (QD). Light emitted from the conversion particles of a conversion filter CVF may be radiated in various directions.

In some embodiments, each of the conversion filters CVF may include a first (i.e., first-type) conversion filter CVF1 and a second (i.e., second-type) conversion filter CVF2. The light blocking layer BM may include portions provided between the first and second conversion filters CVF1 and CVF2 and may define a boundary between the first and second conversion filters CVF1 and CVF2.

When light is incident into a light conversion layer CVL, the first and second conversion filters CVF1 and CVF2 may convert the incident light to lights having different wavelength bands.

In embodiments, the first conversion filter CVF1 may convert the first light (a first-color light) to a second light (a second-color light), i.e., the first conversion filter CVF1 may absorb the first light and then emit the second light. For example, the second light may have a wavelength in a range from about 640 nm to about 780 nm. In other words, the first conversion filter CVF1 may convert substantially a blue light to a red light.

The second conversion filter CVF2 may convert the first light to a third light (a third-color light), i.e., the second conversion filter CVF2 may absorb the first light and then emit the third light. For example, the third light may have a wavelength in a range from about 480 nm to about 560 nm. In other words, the second conversion filter CVF2 may convert substantially a blue light to a green light.

As described above, the wavelength of the converted light may be determined by a particle size of the quantum dot. In embodiments, the first conversion filter CVF1 may include first conversion particles QD1, and the second conversion filter CVF2 may include second conversion particles QD2. In embodiments, the first conversion particles QD1 may have sizes larger than those of the second conversion particles QD2.

In embodiments, each of the conversion filters CVF may have a thickness of about 7 μm or thicker. The thickness may be defined as a length in the third direction DR3. If a thickness of each of the conversion filters CVF is less than 7 μm, a conversion rate of light incident into the light conversion layer CVL may be insufficient. As an example, if the thickness of each of the conversion filters CVF is 6 μm, a conversion rate of light incident into the light conversion layer CVL may be less than 20%, such that color reproduction characteristics of the display device 1000 may be unsatisfactory.

The dummy patterns DP and the conversion filters CVF may be alternately arranged on the same layer. In embodiments, a dummy pattern DP may be a colorless filter or a gray filter. If the light source units LSU of the light source LS are configured to emit a blue light, the dummy pattern DP may transmit the blue light without a change in color. That is, light emitted from the dummy pattern DP may be the same blue light.

In embodiments, various materials may be used for the dummy pattern DP.

In certain embodiments, although not shown in the drawings, the dummy pattern DP may include a plurality of blue pigments.

The dummy pattern DP may reduce a difference in height between a region with a conversion filter CVF and a region without a conversion filter CVF. In certain embodiments, the dummy pattern DP may be unnecessary.

The over-coating layer OCL may be provided on the conversion filters CVF and the dummy patterns DP to cover the conversion filters CVF, the dummy patterns DP, and the top surface of the light blocking layer BM exposed by them. The over-coating layer OCL may protect the conversion filters CVF and the dummy pattern DP. The over-coating layer OCL may have a planarized surface.

The second substrate SUB2 may be provided on the over-coating layer OCL. The second polarization layer OPL2 (shown in FIG. 3) may be provided on the second substrate SUB2. For example, the second polarization layer OPL2 may be a wire grid polarizer formed on the second substrate SUB2.

In certain embodiments, the second substrate SUB2 may be unnecessary. In this case, the second polarization layer OPL2 may be directly formed on the over-coating layer OCL.

The color filter layer CFL may be provided on the second surface S2 of the first substrate SUB1. The color filter layer CFL may include a color filter CF and an encapsulation layer ENL.

The color filter CF may overlap the first and second conversion filters CVF1 and CVF2. The color filter CF may absorb first-color light, may transmit second-color light, and may transmit third-color light. If a part of a first-color light is incident into the first conversion filter CVF1 but is not converted into second-color light (that is, passes through the first conversion filter CVF1 without conversion), it may be absorbed by the color filter CF. If a part of a first-color light is incident into the second conversion filter CVF2 but is not converted into third-color light (that is, passes through the second conversion filter CVF2 without conversion), it may be absorbed by the color filter CF.

In embodiments, the color filter CF may include polymer. Furthermore, the color filter CF may have a specific color. For example, the color filter CF may be a yellow color filter for absorbing a blue light.

In embodiments, the color filter CF may have a thickness of about 1 μm or thicker.

In embodiments, the color filter CF may have a third refractive index n3. The third refractive index n3 may be higher than the first refractive index n1 and may be smaller than the second refractive index n2. For example, the third refractive index n3 may be in a range from about 1.55 to about 1.65.

The encapsulation layer ENL may be provided on the color filter CF to cover the color filter CF and a region of the second surface S2 exposed by the color filter CF. The encapsulation layer ENL may protect the color filter CF and may provide a planarized top surface. In certain embodiments, the encapsulation layer ENL may be unnecessary.

If the color filter CF is provided on the first surface S1, not on the second surface S2 (i.e., the light conversion layer CVL includes the color filter CF), the color filter CF may be in direct contact with the first and second conversion filters CVF1 and CVF2. In this case, the first conversion particles QD1 of the first conversion filter CVF1 or the second conversion particles QD2 of the second conversion filter CVF2 may be damaged, due to the chemical reaction between the color filter CF and the first conversion filter CVF1 or between the color filter CF and the second conversion filter CVF2. As a result, the optical conversion efficiency of the light conversion layer CVL may be reduced. According to embodiments, since the first substrate SUB1 is provided between the color filter CF and the conversion filters CVF, it may be possible to prevent such a reduction in the optical conversion efficiency.

If the color filter CF is provided on the first surface S1, the color filter CF may overlap the first and second conversion filters CVF1 and CVF2, and a thickness of the color filter CF may affect a total thickness of the light conversion layer CVL. As a result, the optical conversion efficiency of the first and second conversion filters CVF1 and CVF2 or the blue light absorptivity of the color filter CF may be reduced. According to some embodiments, the color filter CF may be provided on the second surface S2, not on the first surface S1, and the thickness of the color filter CF and the thickness of the conversion filters CVF may not be limited. As a result, the optical conversion efficiency and the blue light absorptivity may be improved. Advantageously, it may be possible to improve color reproduction characteristics of the display device 1000.

Figure 5A:
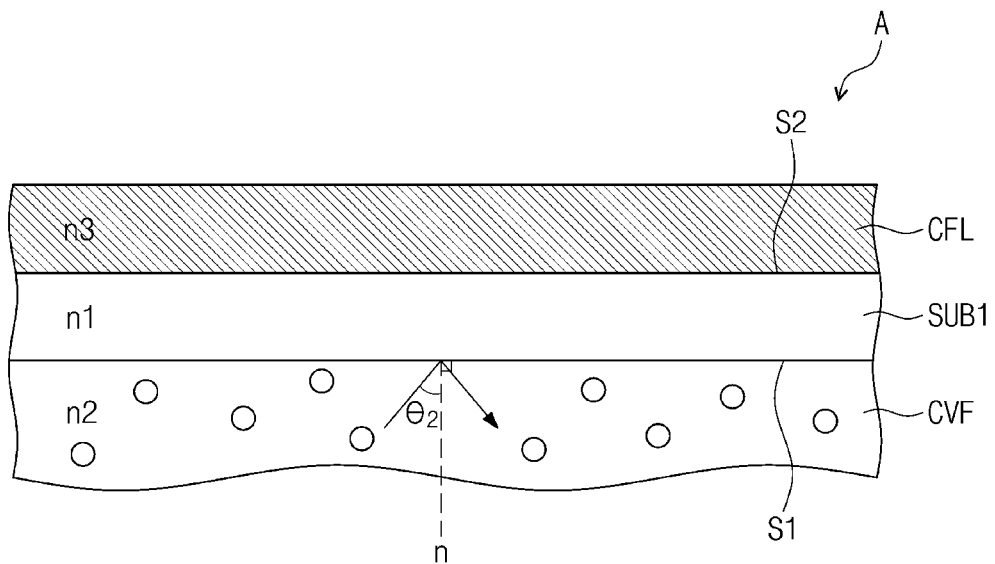
FIG. 5A is an enlarged view of a region A' of FIG. 4 according to embodiments.
Figure 5B:
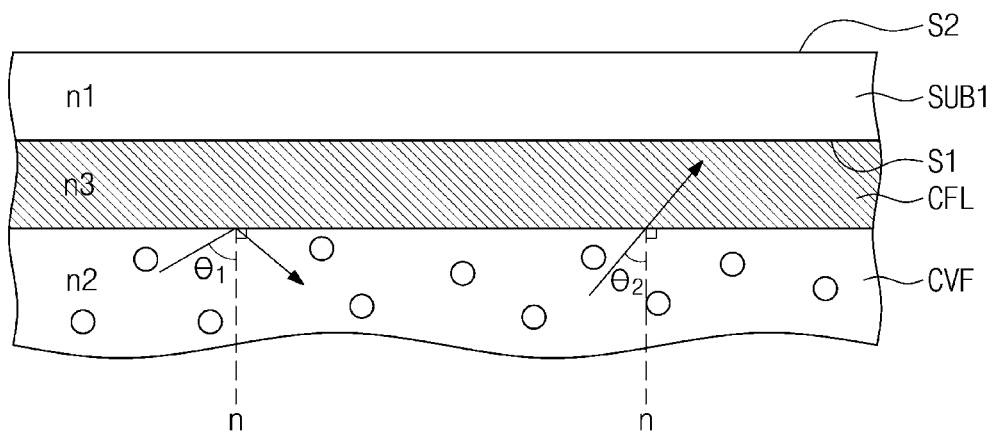
FIG. 5B is a cross-sectional view illustrating a portion of a display device according to a comparative example/embodiment.

FIG. 5A is an enlarged view of a region A of FIG. 4, and FIG. 5B is a cross-sectional view illustrating a portion of a display device according to a comparative example/embodiment. FIG. 5B may illustrate a region analogous to the region A shown in FIG. 5A.

Referring to FIG. 5B, the color filter layer CFL and the light conversion layer CVL may be sequentially stacked on the first substrate SUB1. The light conversion layer CVL may be in direct contact with the color filter layer CFL. In this case, a first part of incident light provided from the light conversion layer CVL may be incident into the color filter layer CFL, and a second part of the incident light may be reflected by an interface between the color filter layer CFL and the light conversion layer CVL.

An angle between a normal imaginary line n, which is normal to the interface between the color filter layer CFL and the light conversion layer CVL, and the incident light may be referred to as an incident angle. If the incident angle is larger than a specific angle, the incident light may be reflected by the interface between the color filter layer CFL and the light conversion layer CVL. The specific angle may be referred to as a total reflection angle. The total reflection angle may be determined by the Snell's law. Referring to FIG. 5B, if the color filter layer CFL and the light conversion layer CVL are sequentially stacked on the first substrate SUB1, the total reflection angle may be a first angle $\theta 1$.

By contrast, as shown in FIG. 5A, according to embodiments, the first substrate SUB1 may be provided between the light conversion layer CVL and the color filter layer CFL. The light conversion layer CVL may be in direct contact with the first substrate SUB1. In this case, a first part of incident light provided from the light conversion layer CVL may be incident into the first substrate SUB1, and a second part of the incident light may be reflected by an interface between the first substrate SUB1 and the light conversion layer CVL.

An angle between a normal imaginary line n, which is normal to the interface between the first substrate SUB1 and the light conversion layer CVL, and the incident light may be referred to as an incident angle. If the incident angle is larger than a specific angle, the incident light may be reflected the interface between the first substrate SUB1 and the light conversion layer CVL. The specific angle may be referred to as a total reflection angle, and in some embodiments, the total reflection angle may be a second angle θ2.

The second angle θ2 may be less than the first angle θ1. In detail, since the first substrate SUB1 has a refractive index lower than that of the color filter layer CFL, a total reflection angle of an incident light may be smaller when the light conversion layer CVL is in contact with the first substrate SUB1 than when the light conversion layer CVL is in contact with the color filter layer CFL. Therefore, an amount of a reflected part of the incident light associated with FIG. 5A may be greater than an amount of a reflected part of the incident light associated with FIG. 5B.

Light reflected toward the light conversion layer CVL may be converted by the conversion filters CVF of the light conversion layer CVL. For example, an unconverted part of light may pass through the light conversion layer CVL, may be reflected from the first substrate SUB1, may not be converted to the second or third light, and the unconverted part of the light may be re-incident into the light conversion layer CVL, and then may be converted by the conversion filters CVF. That is, according to some embodiments, the total reflection angle may be reduced, and the optical conversion efficiency may be increased. If the unconverted part of light is not reflected, the overall optical conversion efficiency may be unsatisfactory, and the image quality may be unsatisfactory.

Figure 6:
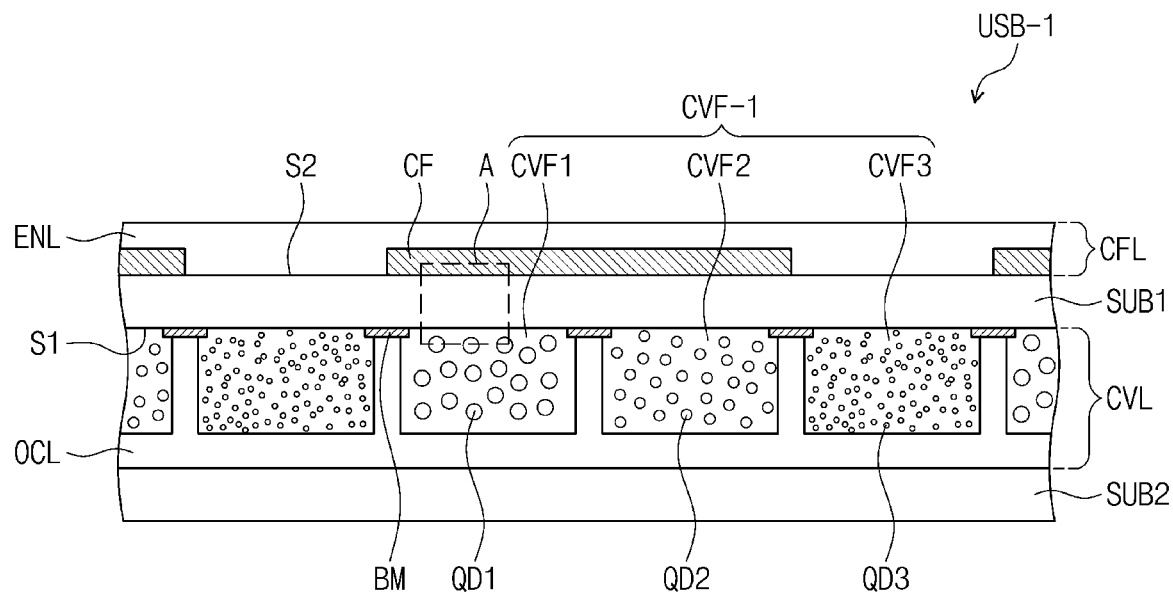
FIG. 6 is an enlarged cross-sectional view illustrating an upper substrate according to embodiments.

FIG. 6 is an enlarged cross-sectional view illustrating an upper substrate according to embodiments.

For concise description, a previously described element may be identified by a similar or identical reference number without repeating description.

Referring to FIG. 6, each of conversion filters CVF-1 may include a first conversion filter CVF1, a second conversion filter CVF2, and a third conversion filter CVF3. The light blocking layer BM may include portions provided between pairs of the conversion filters CVF1, CVF2, and CVF3.

The first and second conversion filters CVF1 and CVF2 may have features described above.

The third conversion filters CVF3 may replace the dummy patterns DP of FIG. 4.

A third conversion filter CVF3 may include third conversion particles QD3. The third conversion particles QD3 may convert incident light to blue light. In embodiments, the third conversion particles QD3 may have sizes smaller than those of the second conversion particles QD2.

In embodiments, the optical conversion efficiency of the light conversion layer CVL may be further increased.

Figure 7:
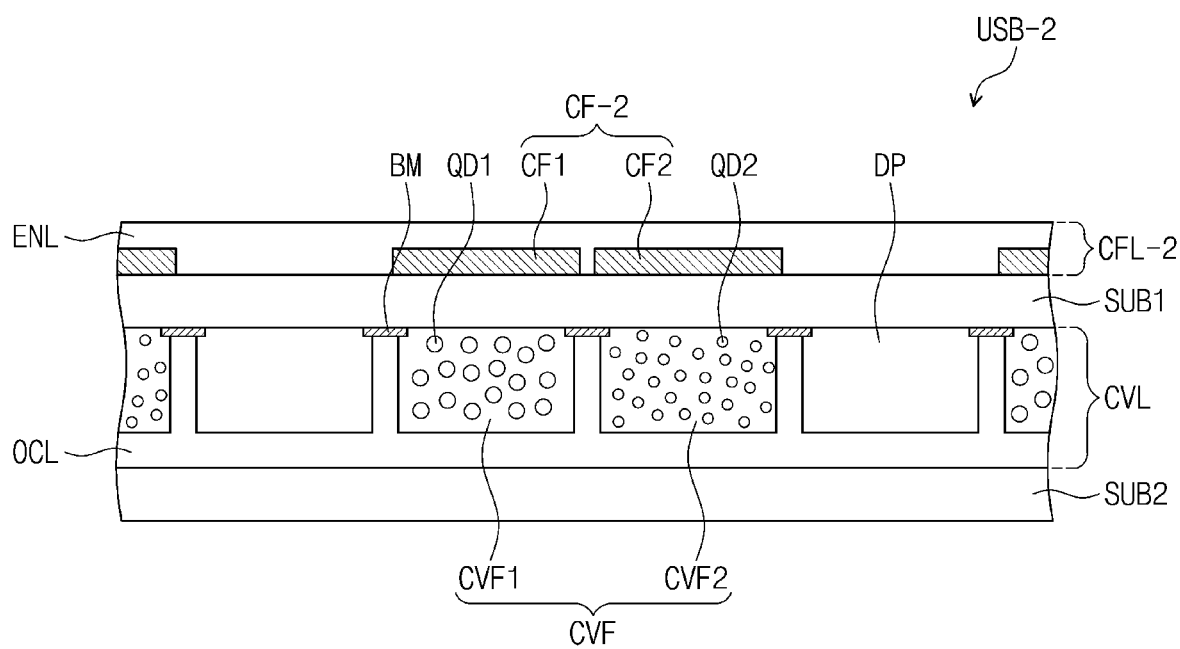
FIG. 7 is an enlarged cross-sectional view illustrating an upper substrate according to embodiments.

FIG. 7 is an enlarged cross-sectional view illustrating an upper substrate according to embodiments.

For concise description, a previously described element may be identified by a similar or identical reference number without repeating description.

Referring to FIG. 7, a color filter layer CFL-2 may include a color filter CF-2 and the encapsulation layer ENL.

The color filter CF-2 may include a first color filter CF1 and a second color filter CF2. The first color filter CF1 may overlap the first conversion filter CVF1. When light is provided from the first conversion filter CVF1, the first color filter CF1 may absorb a first-color light and a third-color light from the light and may transmit a second-color light. For example, the first color filter CF1 may include a red pigment.

The second color filter CF2 may overlap the second conversion filter CVF2. When light is provided from the second conversion filter CVF2, the second color filter CF2 may absorb a first-color light and a second-color light from the light and may transmit a third-color light. For example, the first color filter CF1 may include a green pigment.

In embodiments, the first color filter CF1 and the second color filter may be spaced from each other.

In embodiments, light provided from each of the first and second conversion filters CVF1 and CVF2 may be individually incident into a corresponding one of the first and second color filters CF1 and CF2, and thus color-mixing in the color filter layer CFL-2 may be minimized or prevented. Advantageously, color reproduction characteristics of the display device 1000 may be satisfactory.

Figure 8:
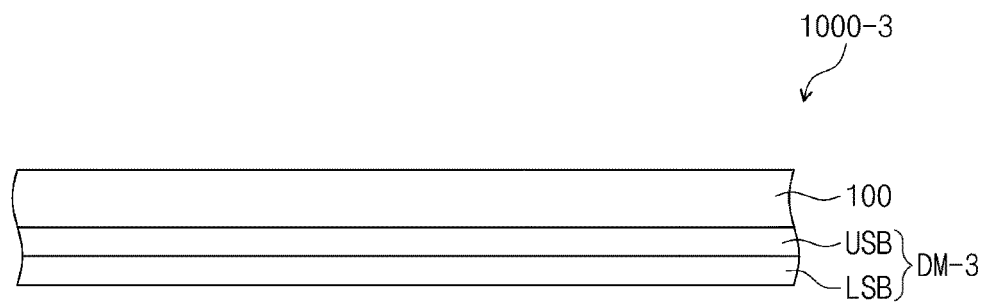
FIG. 8 is a cross-sectional view illustrating a display device according to embodiments.
Figure 9:
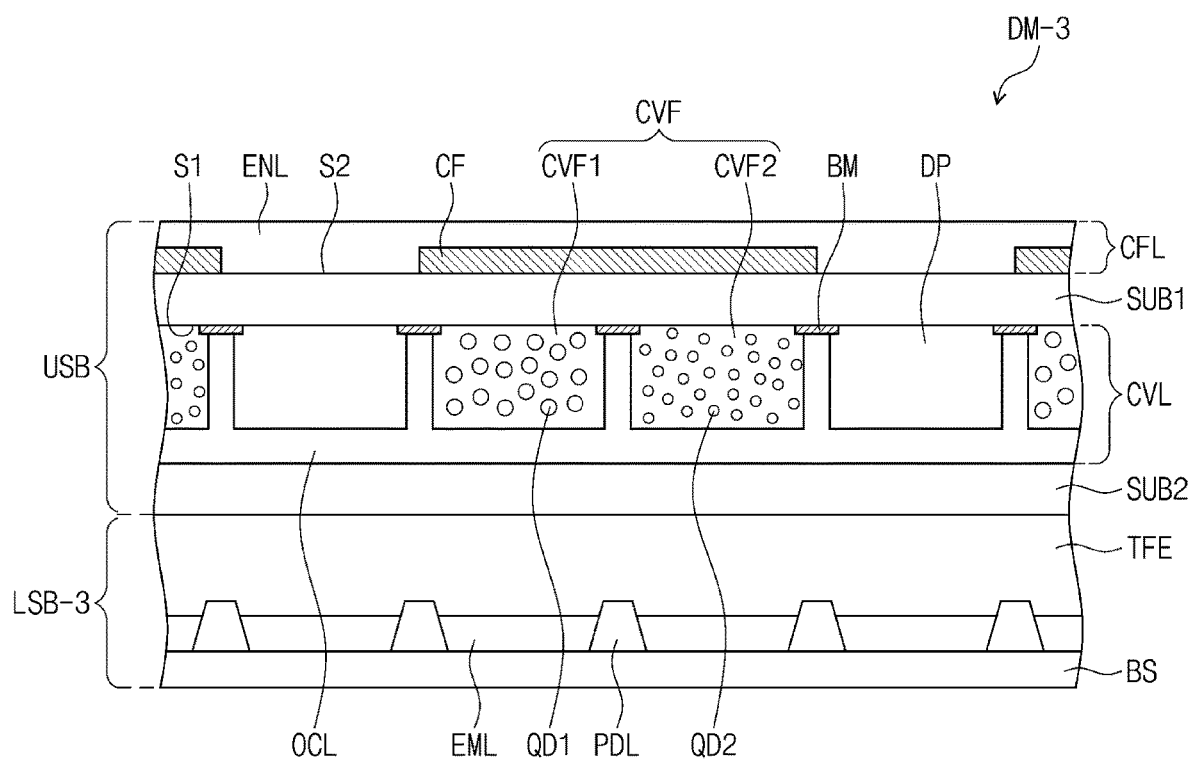
FIG. 9 is an enlarged cross-sectional view illustrating a display module shown in FIG. 8 according to embodiments.

FIG. 8 is a cross-sectional view illustrating a display device according to embodiments, and FIG. 9 is an enlarged cross-sectional view illustrating a display module shown in FIG. 8.

For concise description, a previously described element may be identified by a similar or identical reference number without repeating description.

Referring to FIGS. 8 and 9, a display device 1000-3 may include the window structure 100 and a display module DM-3. The display device 1000-3 may not include the backlight unit BLU shown in FIG. 1. For example, the display module DM-3 may be an organic light emitting diode panel.

The display module DM-3 may include the upper substrate USB and a lower substrate LSB-3. In some embodiments, the lower substrate LSB-3 may include a base substrate BS, a pixel definition layer PDL, and a light emitting layer EML.

At least one pixel region (not shown) and a peripheral region (not shown) adjacent to the pixel region may be defined in the base substrate BS. In embodiments, the base substrate BS may include a plurality of pixel regions, and peripheral regions may be located between pixel regions.

Pixels (not shown) may be provided on the base substrate BS. The pixels may include pixel electrodes (not shown), which are provided in the pixel regions, and thin-film transistors (not shown), which are electrically connected to the pixel electrodes in a one-to-one manner. The thin-film transistors may be connected to the pixel electrodes, respectively, and may selectively provide driving signals to corresponding pixel electrodes. The thin-film transistors may be provided on at least one of the pixel regions and the peripheral regions.

The pixel definition layer PDL may be provided on the peripheral region on the base substrate BS to define the pixel region. In words, a region exposed by the pixel definition layer PDL may be defined as the pixel region. In certain embodiments, the pixel definition layer PDL may be unnecessary.

The light emitting layer EML may be provided on the pixel region. In words, the light emitting layer EML may be provided on the region exposed by the pixel definition layer PDL. The light emitting layer EML may be divided into a plurality of patterns that are formed in the pixels, respectively.

In embodiments, the light emitting layer EML may generate a first light. Accordingly, an image generated from the lower substrate LSB may have substantially the same wavelength band as that of the first light. The image generated from the lower substrate LSB may be incident into the upper substrate USB and may have a changed wavelength band.

In embodiments, the lower substrate LSB-3 may further include a thin-film encapsulation layer TFE. The thin-film encapsulation layer TFE may protect the light emitting layer EML and elements provided on the base substrate BS. In certain embodiments, the thin-film encapsulation layer TFE of the lower substrate LSB-3 may be provided in the form of a substrate.

In certain embodiments, the second substrate SUB2 of the upper substrate USB may be unnecessary.

Figure 10:
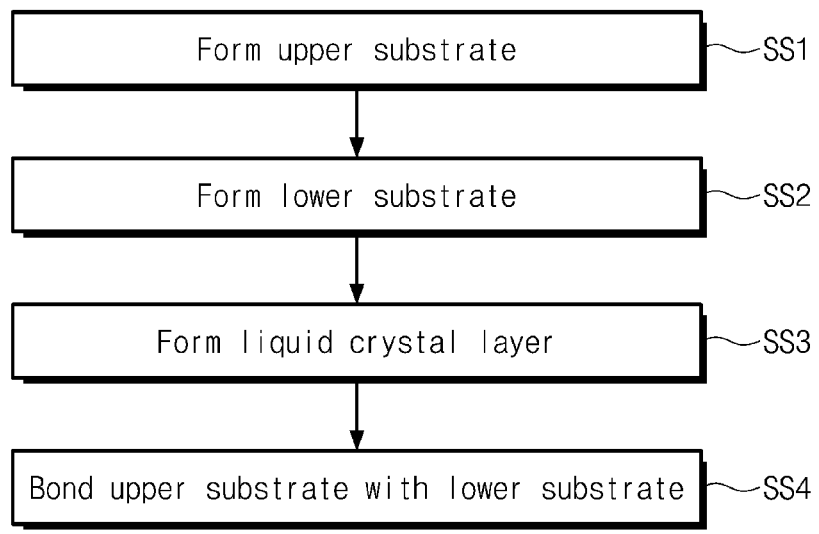
FIG. 10 is a flow chart illustrating a method of fabricating a display device according to embodiments.

FIG. 10 is a flow chart illustrating a method of fabricating a display device according to some embodiments.

In the following description of FIG. 10, a previously described element may be identified by a similar or identical reference number without repeating description.

Referring to FIGS. 10 and 3, the upper substrate USB and the lower substrate LSB may be formed (in SS1 and SS2). During the formation of the lower substrate LSB, the aforedescribed pixels and interconnection lines connected to the pixels may be formed on the lower substrate LSB.

A method of forming the upper substrate USB will be described in more detail with reference to FIGS. 11 to 13 and FIGS. 14A to 14H.

After the formation of the upper substrate USB and the lower substrate LSB, the liquid crystal layer LCL may be formed between the upper substrate USB and the lower substrate LSB (in SS3). The liquid crystal layer LCL may include a plurality of liquid crystal molecules LCM oriented in a specific direction. Although not shown in the drawings, the formation of the liquid crystal layer LCL may include orienting or aligning the liquid crystal molecules LCM.

In certain embodiments (e.g., in the case of forming the display device 1000-3 of FIGS. 8 and 9), the formation of the liquid crystal layer LCL may be unnecessary. The formation of the lower substrate LSB-3 of FIGS. 8 and 9 may include forming the pixel definition layer PDL on the base substrate BS and then sequentially forming the light emitting layer EML and thin-film encapsulation layer EML.

In embodiments, after the formation of the liquid crystal layer LCL, the upper substrate USB may be bonded with the lower substrate LSB (in SS4). For example, an encapsulation member may be formed at an edge of each of the upper substrate USB and the lower substrate LSB to bond the upper substrate USB with the lower substrate LSB.

The method of fabricating the display device 1000 may further include forming a first polarization layer on an outer side surface of the lower substrate LSB. In embodiments, the first polarization layer may be provided in the form of a wire grid on an inner side surface of the lower substrate LSB, before forming pixels on the lower substrate LSB.

Figure 11:
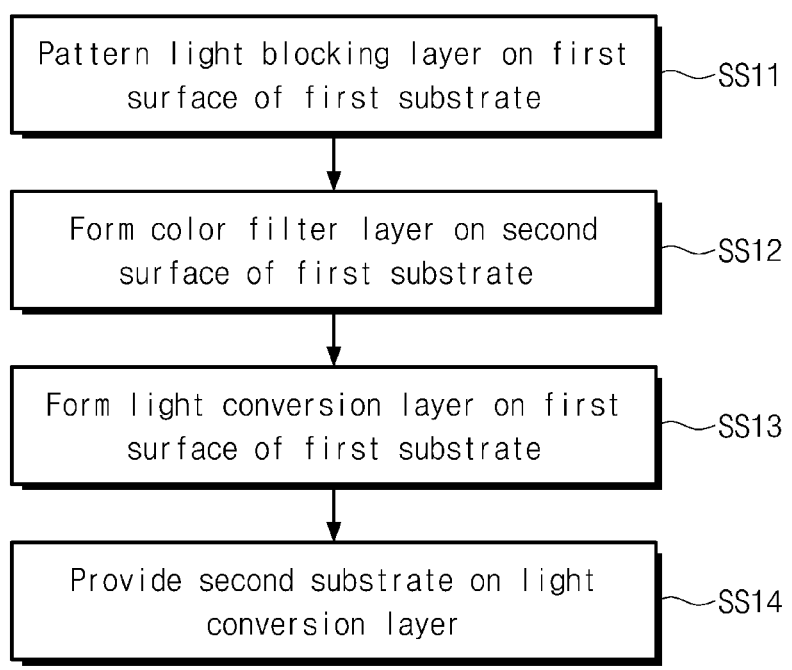
FIG. 11 is a flow chart illustrating a method of fabricating an upper substrate according to embodiments.
Figure 12:
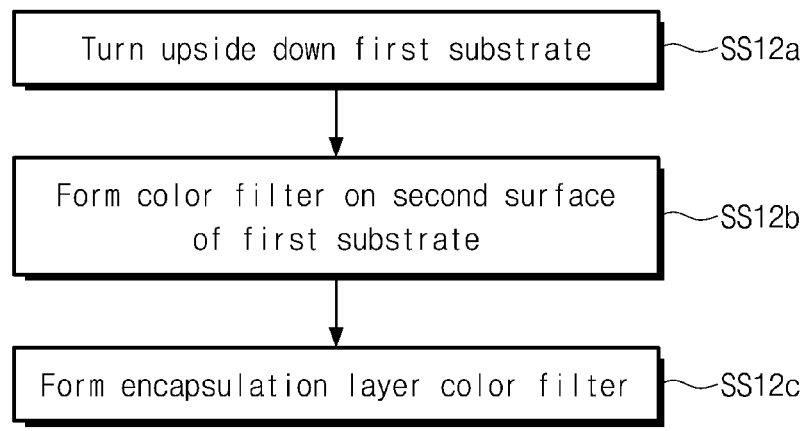
FIG. 12 is a flow chart illustrating a step of forming a color filter layer according to embodiments.

FIG. 11 is a flow chart illustrating a method of fabricating an upper substrate according to embodiments, and FIG. 12 is a flow chart illustrating a step of forming a color filter layer according to embodiments.

Figure 13:
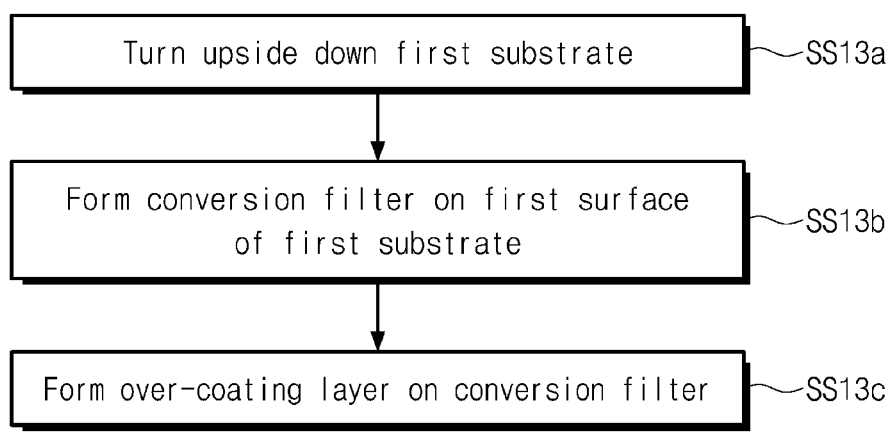
FIG. 13 is a flow chart illustrating a step of forming a light conversion layer according to embodiments.

FIG. 13 is a flow chart illustrating a step of forming a light conversion layer according to embodiments, and FIGS. 14A to 14H are cross-sectional views illustrating a forming method of an upper substrate according to embodiments.

In the following description of FIGS. 11 to 13 and 14A to 14H, a previously described element may be identified by a similar or identical reference number without repeating description.

Figure 14A:
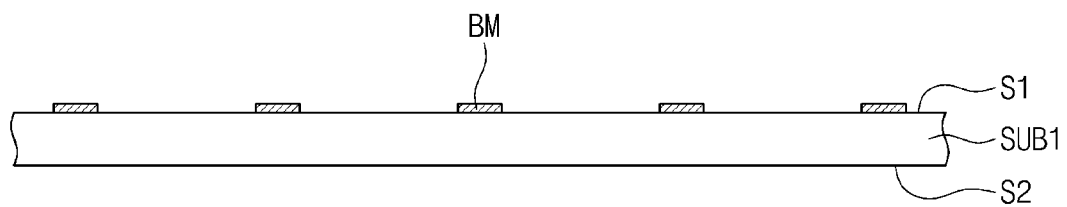
FIG. 14A, FIG. 14B, FIG. 14C, FIG. 14D, FIG. 14E, FIG. 14F, FIG. 14G, and FIG. 14H are cross-sectional views illustrating structures formed in a method of forming an upper substrate according to embodiments.

As shown in FIG. 14A, the formation of the upper substrate USB may include forming the light blocking layer BM on the first surface S1 of the first substrate SUB1 and patterning the light blocking layer BM (in SS11). The patterning of the light blocking layer BM may be performed to expose a region of the first surface S1 corresponding to the pixel regions.

In embodiments, the light blocking layer BM may serve as a guide line in a subsequent stacking process. In certain embodiments, a printing layer or key (not shown) serving as an additional guide line may be formed when the light blocking layer BM is formed.

The light blocking layer BM may be formed of or include a light-blocking material. In embodiments, the light blocking layer BM may be formed of or include a metallic material. The formation of the light blocking layer BM may include forming the metallic material using a deposition process and patterning the same. The light blocking layer BM may be formed to have a thickness ranging from about 0.2 μm to about 0.4 μm.

After the patterning of the light blocking layer BM, the color filter layer CFL may be formed on the second surface S2 of the first substrate SUB1 (in SS12).

Figure 14B:
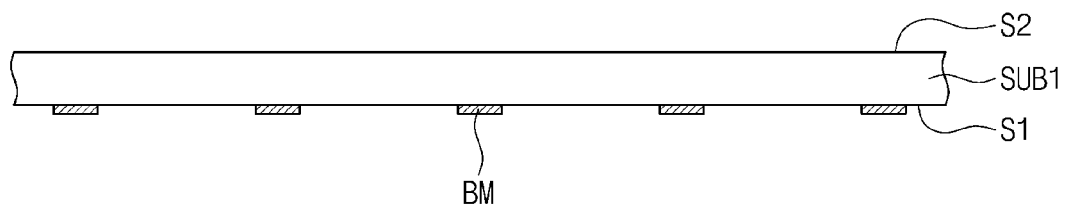

In detail, as shown in FIG. 14B, after the patterning of the light blocking layer BM, the first substrate SUB1 may be firstly turned upside down (in SS12a). The first substrate SUB1 may be turned in such a way that a stacking order of the first and second surfaces S1 and S2 is reversed. For example, the first substrate SUB1 may be turned upside down in such a way that the second surface S2 faces upward and the first surface S1 faces downward.

In embodiments, since the light blocking layer BM is formed of a metallic material, even though the method includes the turning of the first substrate SUB1, the light blocking layer BM is in secure contact with an underlying structure, and the light blocking layer BM may not be easily damaged.

Figure 14C:
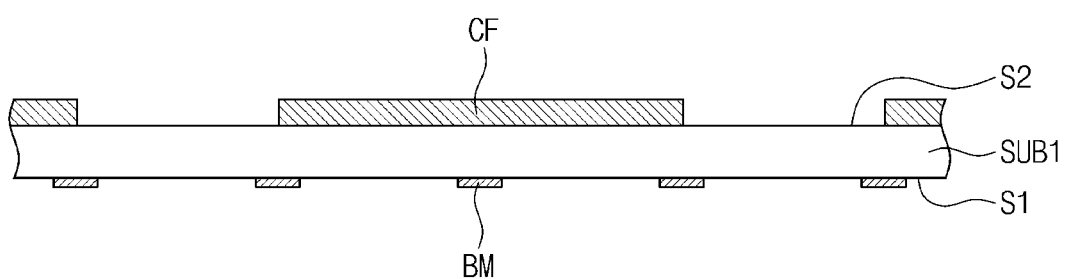

Thereafter, as shown in FIG. 14C, the color filter CF may be formed on the second surface S2 of the first substrate SUB1 (in SS12b). The color filter CF may be formed on at least one pixel region exposed by the light blocking layer BM. For example, the color filter CF may overlap the first and second conversion filters CVF1 and CVF2. Thus, two regions of three pixel regions may overlap the color filter CF. In embodiments, at least one region of three pixel regions may be exposed by the color filter CF.

The color filter CF may be formed by a slit coating process. In embodiments, the color filter CF may include a yellow pigment.

In embodiments, the color filter CF may have a thickness of about 1 μm or thicker. For example, the color filter CF may have a thickness in a range from about 1.2 μm to 1.4 μm.

Figure 14D:
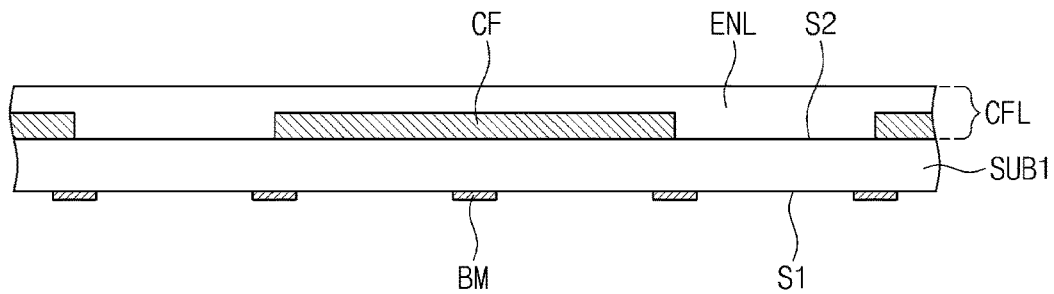

As shown in FIG. 14D, after the formation of the color filter CF, the encapsulation layer ENL may be formed on the color filter CF (in SS12c). The encapsulation layer ENL may cover the color filter CF and a region of the second surface S2 exposed by the color filter CF. The encapsulation layer ENL may protect the color filter CF. In certain embodiments, the formation of the encapsulation layer ENL may be unnecessary.

After the formation of the encapsulation layer ENL, the light conversion layer CVL may be formed on the first surface S1 of the first substrate SUB1 (in SS13).

Figure 14E:
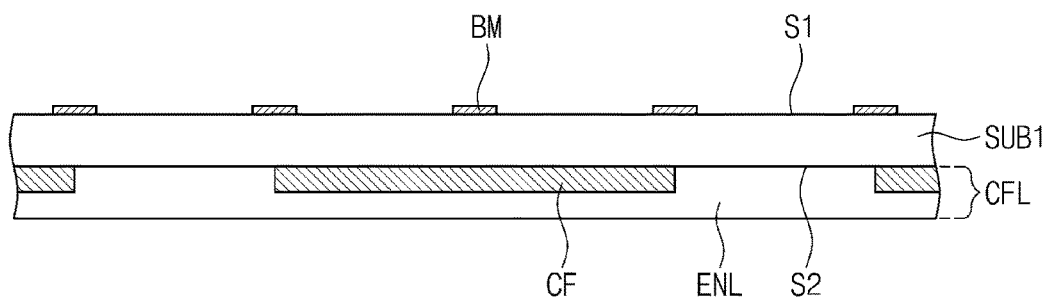

In detail, as shown in FIG. 14E, after the formation of the encapsulation layer ENL, the first substrate SUB1 may be again turned upside down (in SS13a). The first substrate SUB1 may be turned in such a way that a stacking order of the first and second surfaces S1 and S2 is reversed. For example, the first substrate SUB1 may be turned upside down in such a way that the first surface S1 faces upward and the second surface S2 faces downward.

In embodiments, even though the method includes the turning of the first substrate SUB1, the color filter layer CFL is in secure contact with the underlying structure without damage because the color filter CF is protected by the encapsulation layer ENL.

Figure 14F:
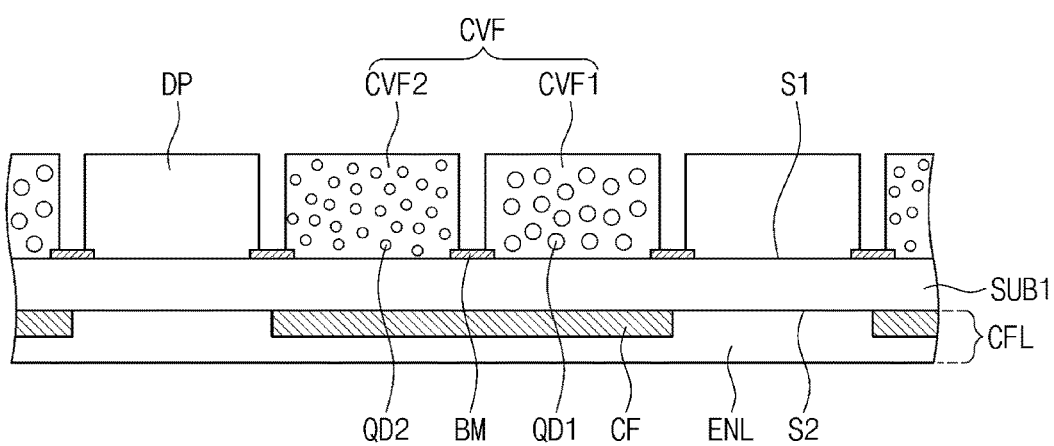

Thereafter, as shown in FIG. 14F, the conversion filters CVF and the dummy pattern DP may be formed on the first surface S1 of the first substrate SUB1 (in SS13b). The first conversion filter CVF1 and the second conversion filter CVF2 may overlap the color filter CF. The dummy pattern DP may not overlap the color filter CF. In certain embodiments, the formation of the dummy pattern DP may be unnecessary.

Figure 14G:
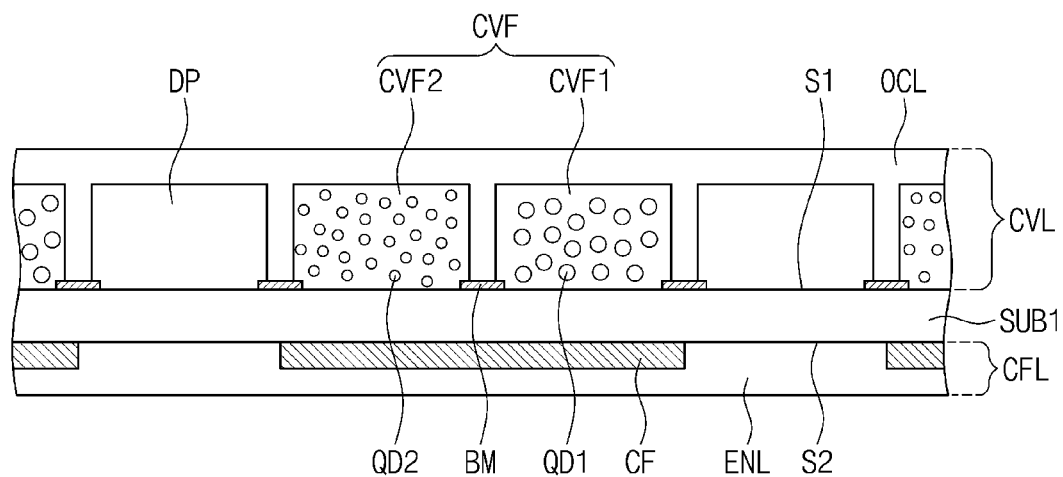

As shown in FIG. 14G, after the formation of the conversion filters CVF, the over-coating layer OCL may be formed on the conversion filters CVF and the dummy pattern DP (in SS13c). The over-coating layer OCL may protect the conversion filters CVF and the dummy pattern DP and may have a planarized top surface. For example, the over-coating layer OCL may be formed in such a way that a variation in height of the top surface of the over-coating layer OCL is less than about 300 Å.

Figure 14H:
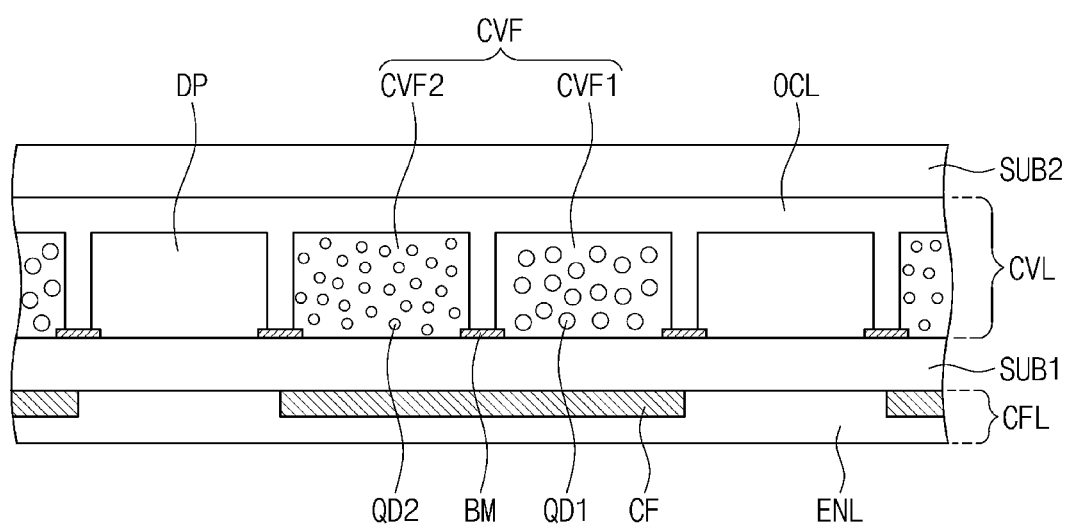

As shown in FIG. 14H, the second substrate SUB2 may be provided on the over-coating layer OCL (in SS14), after the formation of the over-coating layer OCL.

The method of fabricating the display device 1000 may further include forming the second polarization layer OPL2 on the second substrate SUB2. The second polarization layer OPL2 may be a wire grid polarizer. In certain embodiments, the formation of the second substrate SUB2 (in SS14) may be unnecessary. In this case, the second polarization layer OPL2 may be directly formed on the light conversion layer CVL.

In some embodiments, the color filter layer CFL may be formed in advance before the formation of the light conversion layer CVL. Accordingly, when the light conversion layer CVL is formed, the color filter layer CFL may be in contact with the underlying structure.

In embodiments, the color filter layer CFL is formed in advance before the formation of the light conversion layer CVL, and thus damage to the light conversion layer CVL (and/or the color filter layer CFL) in a process of fabricating a display device may be prevented or minimized.

According to some embodiments, satisfactory display quality of a display device may be attained.

While example embodiments have been shown and described, variations may be made in the embodiments without departing from the spirit and scope defined by the attached claims.

What is claimed is:

1. A method of fabricating a display device, comprising:
   patterning a light blocking layer on a first surface of a first substrate;
   forming a color filter layer on a second surface of the first substrate opposite the first surface, after the patterning of the light blocking layer; and
   forming a light conversion layer including a plurality of conversion filters and a plurality of colorless or gray members, on the first surface of the first substrate, after the forming of the color filter layer,
   wherein a thickness of one of the colorless or gray members in a direction perpendicular to the first surface of the first substrate is equal to a thickness of one of the conversion filters in the direction,
   wherein each of the conversion filters comprises a plurality of conversion particles, and
   wherein the color filter layer comprises a first color filter and a second color filter both directly contacting the second surface, wherein the first color filter is configured to absorb a portion of a first-color light and a third-color light, and wherein the second color filter is configured to absorb a portion of the first-color light and a second-color light.

2. The method of claim 1, wherein the first-color light is a blue light,
   the second-color light is a red light, and
   the third-color light is a green light.

3. The method of claim 1, wherein the light blocking layer comprises a metallic material.

4. The method of claim 1, wherein the conversion filters comprise:
   a first conversion filter including first-type conversion particles for converting a first-color light into a second-color light; and
   a second conversion filter including second-type conversion particles for converting the first-color light into a third-color light.

5. The method of claim 1, further comprising:
   forming a pixel definition layer on a base substrate;
   forming a light emitting layer on a region of the base substrate exposed by the pixel definition layer; and
   positioning the first substrate and the base substrate to overlap each other.

6. The method of claim 1, further comprising forming a polarization layer on the light conversion layer.

7. The method of claim 1, wherein the forming of the color filter layer comprises:
   turning upside down the first substrate; and
   forming the first color filter on the second surface of the first substrate.

8. The method of claim 7, wherein the forming of the color filter layer further comprises forming an encapsulation layer on the first color filter.

9. The method of claim 7, wherein the first color filter has a thickness of 1 μm or thicker.

10. The method of claim 1, wherein the forming of the light conversion layer comprises:
    turning upside down the first substrate;
    forming the conversion filters on portions of the first surface of the first substrate exposed by the light blocking layer; and
    forming an over-coating layer on the conversion filters.

11. The method of claim 10, wherein each of the conversion filters has a thickness of 7 μm or thicker.

12. A display device, comprising a display module displaying an image using a first light,
    wherein the display module comprises:
    a first substrate including a first surface toward which the first light is incident and a second surface opposite the first surface;
    a light blocking layer provided on the first surface;
    a light conversion layer provided on portions of the first surface exposed by the light blocking layer, wherein the light conversion layer is configured to convert first-color light to a second-color light and a third-color light; and a color filter layer provided on the second surface, wherein the color filter layer comprises a first color filter and a second color filter both directly contacting the second surface, wherein the first color filter is configured to absorb a portion of the third-color light, and wherein the second color filter is configured to absorb a portion of the second-color light.

13. The display device of claim 12, further comprising:
a light source configured to provide the first-color light to the display module; and
a liquid crystal layer overlapping the first substrate.

14. The display device of claim 12, further comprising:
a base substrate overlapping the first substrate; and
a light emitting layer provided on the base substrate and configured to generate the first-color light.

15. The display device of claim 12, further comprising: an encapsulation layer covering the first color filter and the second color filter, wherein a portion of the encapsulation layer is positioned between the first color filter and the second color filter and directly contacts each of the first color filter and the second color filter.

16. The display device of claim 12, wherein each of the first color filter and the second color filter has a thickness of 1 µm or thicker.

17. The display device of claim 12, further comprising: an over-coating layer, wherein the light conversion layer comprises:
a first conversion filter including first-type conversion particles for converting a first portion of the first-color light to the second-color light; and
a second conversion filter including second-type conversion particles for converting a second portion of the first-color light to the third-color light, and
wherein the over-coating layer covers the first conversion filter and the second conversion filter.

18. The display device of claim 17, wherein the display module further comprises a wire grid polarizer provided on the over-coating layer.

* * * * *